(12) United States Patent
Apalkov et al.

(10) Patent No.: US 10,439,133 B2
(45) Date of Patent: Oct. 8, 2019

(54) METHOD AND SYSTEM FOR PROVIDING A MAGNETIC JUNCTION HAVING A LOW DAMPING HYBRID FREE LAYER

(71) Applicant: Samsung Electronics Co., LTD., Gyeonggi-do (KR)

(72) Inventors: Dmytro Apalkov, San Jose, CA (US); Xueti Tang, Fremont, CA (US); Vladimir Nikitin, Campbell, CA (US); Shuxia Wang, San Jose, CA (US); Gen Feng, North Potomac, MD (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/603,402

(22) Filed: May 23, 2017

(65) Prior Publication Data

US 2018/0261762 A1    Sep. 13, 2018

Related U.S. Application Data

(60) Provisional application No. 62/470,842, filed on Mar. 13, 2017.

(51) Int. Cl.
| | | |
|---|---|---|
| *H01L 43/00* | (2006.01) | |
| *H01L 43/08* | (2006.01) | |
| *H01L 43/12* | (2006.01) | |
| *G11C 11/16* | (2006.01) | |
| *H01L 43/10* | (2006.01) | |

(52) U.S. Cl.
CPC .......... *H01L 43/08* (2013.01); *G11C 11/161* (2013.01); *H01L 43/10* (2013.01); *H01L 43/12* (2013.01)

(58) Field of Classification Search
CPC .................... H01L 43/10; H01L 43/12
See application file for complete search history.

(56) References Cited

U.S. PATENT DOCUMENTS

| | | | |
|---|---|---|---|
| 7,829,964 B2 | 11/2010 | Chen | |
| 7,932,571 B2 | 4/2011 | Rizzo | |
| 8,018,691 B2 | 9/2011 | Gill | |
| 8,492,860 B2 | 7/2013 | Zhou | |
| 8,503,225 B2 | 8/2013 | Lombard | |
| 8,963,579 B2 | 2/2015 | Nikonov | |
| 9,437,268 B2 | 9/2016 | Wang | |
| 2012/0261776 A1* | 10/2012 | Tang | ........... H01L 43/08 257/421 |
| 2015/0295167 A1* | 10/2015 | Apalkov | ........... H01L 43/10 257/421 |
| 2017/0141297 A1* | 5/2017 | Apalkov | ........... H01L 43/08 |

* cited by examiner

*Primary Examiner* — Samuel A Gerbremariam
(74) *Attorney, Agent, or Firm* — Van Pelt, Yi & James LLP

(57) ABSTRACT

A magnetic junction and method for providing the magnetic junction are described. The magnetic junction includes a reference layer, a nonmagnetic spacer layer and a hybrid free layer. The hybrid free layer is switchable between stable magnetic states using a current passed through the magnetic junction. The nonmagnetic spacer layer is between the free layer and the reference layer. The hybrid free layer includes a soft magnetic layer, a hard magnetic layer and an oxide coupling layer between the hard magnetic layer and the soft magnetic layer. The soft magnetic layer has a soft layer magnetic thermal stability coefficient of not more than thirty. The hard magnetic layer has a hard layer magnetic thermal stability coefficient of at least twice the soft layer magnetic thermal stability coefficient.

17 Claims, 9 Drawing Sheets

METHOD AND SYSTEM FOR PROVIDING A MAGNETIC JUNCTION HAVING A LOW DAMPING HYBRID FREE LAYER

CROSS REFERENCE TO RELATED APPLICATIONS

This application claims priority to U.S. Provisional Patent Application No. 62/470,842, filed on Mar. 13, 2017 and is incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional reference layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional reference layer and the conventional free layer are magnetic. The magnetization of the conventional reference layer is fixed, or pinned, in a particular direction. The conventional free layer has a changeable magnetization. The conventional free layer may be a single layer or include multiple layers.

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom reference layer. When a sufficient current is driven from the bottom contact to the top contact, the magnetization of the free layer may switch to be antiparallel to that of the bottom reference layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM are desired. For example, a lower switching current may be desired for easier and faster switching. In addition, the magnetic moment of the free layer is desired to be thermally stable in the absence of a switching current being applied. Accordingly, what is needed is a method and system that may improve the switching and stability of the spin transfer torque based memories. The method and system described herein address such a need.

BRIEF SUMMARY OF THE INVENTION

A magnetic junction and method for providing the magnetic junction are described. The magnetic junction includes a reference layer, a nonmagnetic spacer layer and a hybrid free layer. The hybrid free layer is switchable between stable magnetic states using a current passed through the magnetic junction. The nonmagnetic spacer layer is between the free layer and the reference layer. The hybrid free layer includes a soft magnetic layer, a hard magnetic layer and an oxide coupling layer between the hard magnetic layer and the soft magnetic layer. The soft magnetic layer has a soft layer magnetic thermal stability coefficient of not more than thirty. The hard magnetic layer has a hard layer magnetic thermal stability coefficient of at least twice the soft layer magnetic thermal stability coefficient.

The magnetic junction has a hybrid free layer that may have reduced damping and increased in the quantity magnetic thermal stability coefficient divided by the critical switching current density. As a result, performance may be improved.

DETAILED DESCRIPTION OF THE INVENTION

Figure 1:
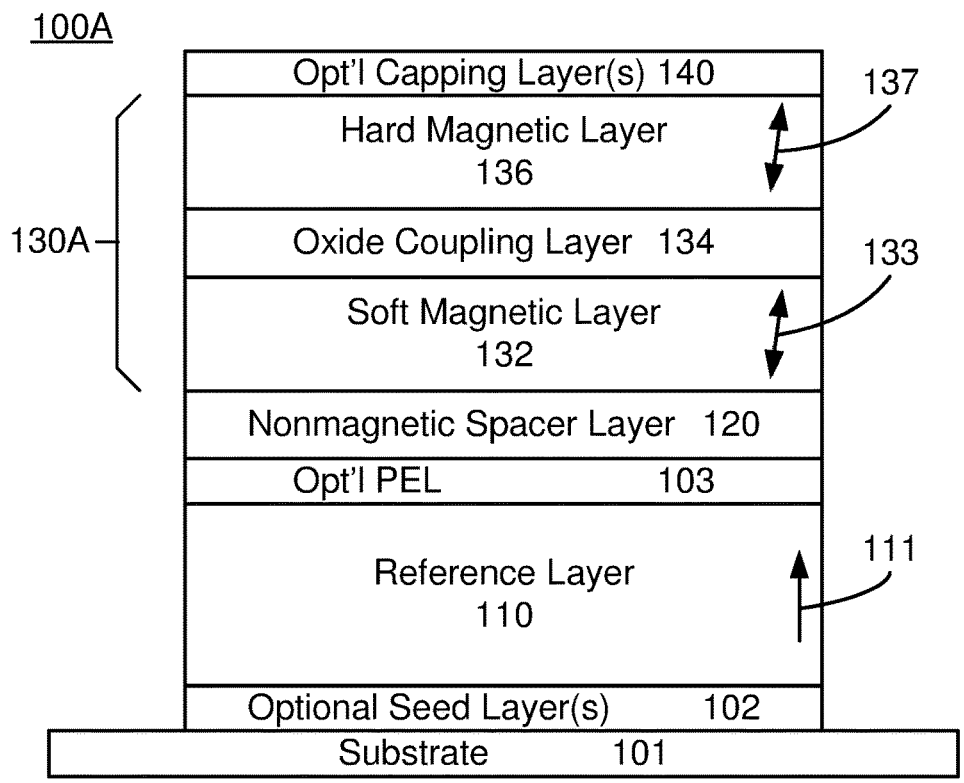
FIG. 1 depicts an exemplary embodiment of a magnetic junction usable in a magnetic devices and having a hybrid free layer including an oxide coupling layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The exemplary embodiments may also be used in other magnetic devices not configured for use as a magnetic memory. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction and method for providing the magnetic junction are described. The magnetic junction includes a reference layer, a nonmagnetic spacer layer and a hybrid free layer. The hybrid free layer is switchable between stable magnetic states using a current passed through the magnetic junction. The nonmagnetic spacer layer is between the free layer and the reference layer. The hybrid free layer includes a soft magnetic layer, a hard magnetic layer and an oxide coupling layer between the hard magnetic layer and the soft magnetic layer. The soft magnetic layer has a soft layer magnetic thermal stability coefficient of not more than thirty. The hard magnetic layer has a hard layer magnetic thermal stability coefficient of at least twice the soft layer magnetic thermal stability coefficient.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used. The magnetic junction are also described in the context of layers having particular thicknesses and depicted as continuous layers having a constant thickness. One of ordinary skill in the art will understand that particularly for very thin layers, one or more layer(s) of the magnetic junction may have a thickness that varies across the magnetic junction and/or may be discontinuous.

FIG. 1 depicts an exemplary embodiment of a magnetic junction 100A usable in a magnetic devices such as a magnetic memory programmable using spin transfer torque and having a hybrid free layer. For clarity, FIG. 1 is not to scale. The magnetic junction 100A may be used in a magnetic device such as a spin transfer torque magnetic random access memory (STT-MRAM) and, therefore, in a variety of electronic devices. The magnetic junction 100A includes a reference layer 110 having a magnetic moment 111, a nonmagnetic spacer layer 120 and a hybrid free layer 130A. The magnetic junction 100A may also include one or more polarization enhancement layer (PELs) 103. The PEL 103 may include CoFeB, CoFeC and/or a similar material. In other embodiments, the PEL 103 may be omitted or additional PELs may be employed. For example, a PEL between the nonmagnetic spacer layer 120 and the hybrid free layer 130A may be present. Also shown are optional seed layer(s) 102 and capping layer(s) 140. The substrate 101 on which the magnetic junction 100A is formed resides below the seed layers. A bottom contact and a top contact are not shown but may be formed. The seed layer(s) 102 and capping layer(s) 140 may be used to tailor the properties of the hybrid free layer 130A and/or reference layer 110. For example, the capping layer(s) 140 may be desired to include one or more of MgO layer, a TaO, a HfO, a ZrO layer, an Mg/Ir layer, an Mg/Ru layer and an Mg/Re layer. The Mg/Ir layer, the Mg/Ru layer and the Mg/Re layers are bilayers as deposited, plasma treated, in-situ annealed and oxidized as described below.

As can be seen in FIG. 1, the magnetic junction 100A is a bottom pinned magnetic junction that is self-pinned. In other embodiments, optional pinning layer(s) (not shown)

may be used to fix the magnetization of the reference layer 110. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moment 111 of the reference layer 110 is pinned by the magnetic anisotropy of the layer 110.

The magnetic junction 100A is also configured to allow the free layer magnetic moments 133 and 137 to be switched between stable magnetic states using a write current passed through the magnetic junction 100A. Thus, the free layer 130A is switchable utilizing spin transfer torque when a write current is driven through the magnetic junction 100A in a current perpendicular-to-plane (CPP) direction. The direction of the magnetic moments 133 and 137 of the free layer 130A may be read by driving a read current through the magnetic junction 100A.

The magnetic moments 133 and 137 are depicted as being canted from the perpendicular-to-plane direction. Thus, the magnetic moments are stable at a few degrees (less than twenty degrees) from the perpendicular-to-plane direction that the reference layer magnetic moment 111 is shown aligned with. Such a configuration may be desirable for faster switching. In some embodiments, switching for such a configuration may be in the sub-five nanosecond regime. In other embodiments, the magnetic moment(s) 133 and/or 136 may be aligned in another direction including but not limited to perpendicular-to-plane.

The nonmagnetic spacer layer(s) 120 may be a tunneling barrier layer. For example, the nonmagnetic spacer layer 120 may be a crystalline MgO tunneling barrier with a (100) orientation. For example, the tunneling barrier layer 120 may be not more than 1.5 nm thick in some embodiments. In some such embodiments, the thickness of the tunneling barrier layer 120 may not exceed one nanometer. In general, the tunneling barrier layer 120 is desired to have different thicknesses. Such a nonmagnetic spacer layer 120 may enhance TMR of the magnetic junction 100A. In other embodiments, the nonmagnetic spacer layer 120 may be formed of additional and/or other material(s) including but not limited to conductors.

The reference layer 110 is shown as being a simple, single layer. However, in other embodiments, the reference layer 110 may be a multilayer. For example, the reference layer 110 might be a synthetic antiferromagnet (SAF) including two magnetically coupled ferromagnetic layers separated by and sandwiching a nonmagnetic layer, such as Ru. The reference layer 110 has a high perpendicular magnetic anisotropy. Stated differently, the perpendicular magnetic anisotropy energy exceeds the out-of-plane demagnetization energy for the reference layer 110. Such a configuration allows for the magnetic moment(s) of the reference layer 110 to be stable perpendicular to plane or in another direction that may be close to perpendicular to plane. Thus, the magnetic moment(s) of the reference layer 110 are stable out-of-plane. In an alternate embodiment, the magnetic moments of the layer 110 may be stable in-plane. In some embodiments, the reference layer 110 may be a high perpendicular anisotropy ($H_k$) multilayer(s). For example, the reference layer 110 may be or include a Co/Pt, Co/Ni and/or Co/Ir multilayer. Other reference layer(s) having other structures may be used. In addition, in alternate embodiments, the reference layer 110 may have the magnetic moment 111 in plane.

The hybrid free layer 130A includes two magnetic layers 132 and 136 and an oxide coupling layer 134. The soft magnetic layer 132 is closest to the nonmagnetic spacer layer 120, while the hard magnetic layer 136 is further from the nonmagnetic spacer layer. In an alternate embodiment, the locations of the layers 132 and 136 may be reversed. The hybrid free layer 130A has a high perpendicular magnetic anisotropy. Stated differently, the perpendicular magnetic anisotropy energy exceeds the out-of-plane demagnetization energy for the hybrid free layer 130A. The magnetic moments of the layer 130A may be stable out-of-plane. In an alternate embodiment, the magnetic moments of the layer 130A may be stable in-plane. In some embodiments, the soft magnetic layer 132 has a perpendicular magnetic anisotropy field of at least −2 kOe and not more than 0 kOe. For example, such a soft magnetic layer 132 may include a bilayer of a CoFeB layer having twenty to fifty atomic percent B and an Fe layer or CoFeB with a different Boron content. The first CoFeB layer may be on the order of four to ten Angstroms thick while the second CoFeB or Fe layer may be on the order of five to twelve Angstroms thick. In some embodiments, the hard magnetic layer 136 has a magnetic anisotropy field of at least 3 kOe and not more than 6 kOe. For example, the hard magnetic layer 136 may be a bilayer including a CoFeB layer and an Fe layer or CoFeB layers with different Boron content. The CoFeB layer may be four to ten Angstroms thick, while the second CoFeB or Fe layer is three to seven Angstroms thick. However, other magnetic anisotropies, thicknesses and/or material(s) are possible for the layers 132 and 136.

The each magnetic layer 132 and 136 is also characterized by a magnetic thermal stability coefficient, $\Delta = K_u V/k_B T$, where $K_u$ is a magnetic anisotropy density of the layer, $k_b$ is Boltzmann's constant, T is temperature in Kelvin and V is the volume of the layer 132 or 136. The soft magnetic layer thermal stability coefficient, $\Delta_s$, is thus given by $K_{u\text{-}soft\ layer} V_{soft\ layer}/k_B T$. The hard magnetic layer thermal stability constant, $\Delta_h$, is thus given by $K_{u\text{-}hard\ layer} V_{hard\ layer}/k_B T$. $K_u V$ for a layer is an expression for the (temperature dependent) energy barrier for switching of the magnetic moment of the layer. The magnetic thermal stability coefficient of the entire free layer 120, $\Delta_{free\ layer}$, is at least sixty at non-programming operating temperatures, or standby temperatures such as at and around room temperature. As a result, the hybrid free layer 120 is thermally stable at room temperature. However, the soft magnetic layer 132 has a $\Delta_s$ that is not more than thirty at room/standby temperature. In some such embodiments, $\Delta_s$ is not more than twenty room/standby temperature. In some cases, $\Delta_s$ may be less than twenty at such temperatures. If the soft magnetic layer 132 were not magnetically coupled to the hard magnetic layer 136, the soft magnetic layer 132 may be more likely to switch at a given temperature or in response to a particular current through the magnetic junction 100A because of the low magnetic thermal stability coefficient. The hard magnetic layer 136 has a magnetic thermal stability coefficient, $\Delta_h$, that is at least twice the magnetic thermal stability coefficient of the soft magnetic layer 132 ($\Delta_h \geq 2\Delta_s$). In some embodiments, the hard magnetic layer 136 has a magnetic thermal stability coefficient that is at least three times that of the soft magnetic layer 136 ($\Delta_h \geq 3\Delta_s$). Thus, as their names imply, the hard magnetic layer 136 is more stable than the soft magnetic layer 132.

The oxide coupling layer 134 is generally nonmagnetic and moderates the magnetic interaction between the soft magnetic layer 132 and the hard magnetic layer 136. The oxide coupling layer 134 may include at least one of MgO, MgTiO, MoO, SiO, TiO, TaO, AlO, RuO, NiO, HfO and IrO. In some embodiments, the oxide coupling layer 134 consists at least one of MgO, MgTiO, MoO, SiO, TiO, TaO, AlO, RuO, NiO, HfO, and IrO. For example, the oxide coupling layer 134 may be formed of MgO. Alternatively, the oxide coupling layer 134 may include MgO and MoO. The thickness of the oxide coupling layer 134 may be selected in order to achieve the desired magnitude of the exchange coupling between the layers 132 and 136. For example, the oxide coupling layer 134 may be sufficiently thick that the soft magnetic layer 132 and the hard magnetic layer 136 are magnetically coupled with a characteristic exchange energy density of at least 0.2 erg/cm$^2$ and not more than 0.8 erg/cm$^2$. This may correspond to an exchange field ($H_{ex}$) of at least one thousand Oe and not more than three thousand Oe. In some such embodiments, the characteristic exchange energy density is at least 0.3 erg/cm$^2$ and not more than 0.5 erg/cm$^2$, which may correspond to an $H_{ex}$ of at least one thousand five hundred Oe and not more than two thousand five hundred Oe. In some cases, the target exchange field for the magnetic interaction between the layers 132 and 136 is two thousand Oe. However, other exchange field and exchange energy densities are possible in other embodiments.

The thickness and material(s) used in the oxide coupling layer 134 may be selected to tailor the magnetic coupling between the layers 132 and 136. The desired exchange field may be achieved for an oxide coupling layer 134 having a thickness of least five Angstroms and not more than fifteen Angstroms. In some embodiments, the oxide coupling layer 134, such as an MgO oxide coupling layer 134, is at least six Angstroms thick and not more than nine Angstroms thick for the desired exchange field. Particularly at the lower end of this thickness range, the oxide coupling layer 134 may not be continuous. Thus, despite being depicted as a single layer of uniform thickness, the layer 134 may be discontinuous and have a varying thickness. It is believed, however, that regardless of the pinholes or other discontinuities in the oxide coupling layer 134, the desired exchange interaction between the magnetic layers 132 and 136 may be achieved for the thicknesses described above. This is because the exchange interaction may be averaged between regions of stronger exchange interaction (the discontinuities/pinholes) and regions of lower exchange interaction (the regions in which the oxide layer/islands are present). Thus, the soft magnetic layer 132 and the hard magnetic layer 136 may have the desired magnetic interaction through the oxide coupling layer 134. It is also noted that the oxide coupling layer 134 may be desired to be thin not only to provide the desired exchange interaction between the magnetic layers 132 and 136 but also to be electrically conductive. Thus, a read or write current driven in the CPP direction through the magnetic junction 100A may be conducted through the magnetic junction 100A.

Use of a hybrid free layer 130A including the soft magnetic layer 132, the hard magnetic layer 136 and the oxide coupling layer 134 may improve performance of the magnetic junction 100A. One figure of merit (FOM) for a magnetic junction is the magnetic thermal stability coefficient divided by the critical switching current density ($\Delta/J_{c0}$). The critical switching current density is the current density required to switch the magnetic junction using spin transfer torque. An increase in $\Delta$ corresponds to a free layer 130 that is more stable when quiescent (not being programmed), which is desirable. A decrease in critical switching current density means that the free layer 130 is more easily switched using spin transfer torque, which is also desirable. Thus, a higher FOM is desirable. The combination of the soft magnetic layer 132, oxide coupling layer 134 and hard magnetic layer 136 have an improved FOM. In some cases, an improvement of at least a factor of two in the FOM may be achieved, particularly for the magnetic coupling in the ranges described above. Further, the magnetic junction 100A may not have increased damping. Use of the oxide coupling layer 134 may mitigate damping that would otherwise adversely affect spin transfer torque switching. Thus, the FOM improvement may be achieved without unduly sacrificing damping. Certain oxide coupling layers 134 may also increase the perpendicular magnetic anisotropy (PMA) of the magnetic layers 132 and 136. This may also be advantageous. Performance of the magnetic junction 100A may thus be improved.

Figure 2:
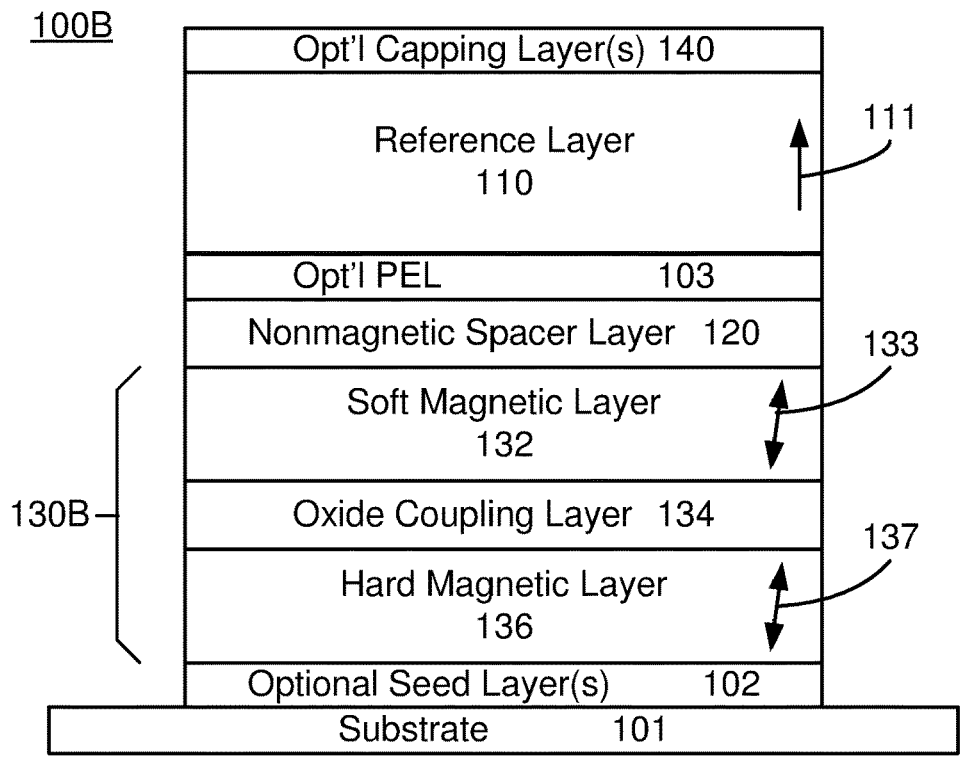
FIG. 2 depicts another exemplary embodiment of a magnetic junction usable in a magnetic devices and having a hybrid free layer including an oxide coupling layer.

FIG. 2 depicts another exemplary embodiment of a magnetic junction 100B usable in a magnetic devices such as a magnetic memory programmable using spin transfer torque and having a hybrid free layer. For clarity, FIG. 2 is not to scale. The magnetic junction 100B is analogous to the magnetic junction 100A. Consequently, similar components have analogous labels. For example, the magnetic junction 100B includes a reference layer 110, an optional PEL 103, a nonmagnetic spacer layer 120, and hybrid free layer 130B that are analogous to the reference layer 110, optional PEL 103, nonmagnetic spacer layer 120 and hybrid free layer 130A, respectively. These layers 110, 103, 120 and 130B have an analogous structure and function to the layers 110, 102, 120 and 130A, respectively, depicted in FIG. 1. For example, the reference layer 110 and the free layer 130B may each have a perpendicular magnetic anisotropy that exceeds the out-of-plane demagnetization energy. Thus, the magnetic moments 111, 133 and 137 may be stable perpendicular-to-plane or canted from perpendicular-to-plane, as shown. Also shown are optional seed layer(s) 102 and optional capping layer(s) 140 that are analogous to the seed layer(s) 102 and capping layer(s) 140 depicted in FIG. 1. However, these seed layer(s) 102 and capping layer(s) 140 may be configured for other purposes because they are adjacent to different layers than for the magnetic junction 100A. In other embodiments, the PEL 103 may be omitted or additional PELs may be employed. The substrate 101 on which the magnetic junction 100B is formed resides below the seed layers. A bottom contact and a top contact are not shown but may be formed.

In contrast to the magnetic junction 100A, the magnetic junction 100B is a top pinned magnetic junction. Thus, the reference layer 110 is further from the substrate 101 than the hybrid free layer 130B. The reference layer 110 is still self-pinned. In other embodiments, optional pinning layer(s) (not shown) may be used to fix the magnetization of the reference layer 110. The magnetic junction 100B is also configured to allow the free layer magnetic moments 133 and 137 to be switched between stable magnetic states using a write current passed through the magnetic junction 100B. Thus, the free layer 130B is switchable utilizing spin transfer torque when a write current is driven through the magnetic junction 100B in a CPP direction. The direction of the magnetic moments 133 and 137 of the free layer 130B may be read by driving a read current through the magnetic junction 100B.

The hybrid free layer 130B includes two magnetic layers 132 and 136 and an oxide coupling layer 134. The hard magnetic layer 136 of the hybrid free layer 130B is adjacent to the optional seed layer 102. In this embodiment, therefore, the optional seed layers 102 may be analogous to the capping layers of FIG. 1. For example, the seed layer(s) may include one or more of an MgO layer, a TaO, a HfO, a ZrO layer, an Mg/Ir layer, an Mg/Ru layer and an Mg/Re layer.

If used, the Mg/Ir layer, Mg/Ru layer, and/or MgRe layer are bilayers as deposited, plasma treated, in-situ annealed and oxidized. However, in other embodiments, other seed layer(s) might be used. The soft magnetic layer 132 is closest to the nonmagnetic spacer layer 120, while the hard magnetic layer 136 is further from the nonmagnetic spacer layer 120. In an alternate embodiment, the locations of the layers 132 and 136 may be reversed.

The magnetic thermal stability coefficients, $\Delta_s$ and $\Delta_n$, of the hybrid free layer 130B are analogous to those described above. The soft magnetic layer 132 has a $\Delta_s$ that is not more than thirty at room/standby temperature. In some such embodiments, $\Delta_s$ is not more than twenty room/standby temperature. In some cases, $\Delta_s$ may be less than twenty at such temperatures. The hard magnetic layer 136 has a magnetic thermal stability coefficient, $\Delta_n$, that is at least twice the magnetic thermal stability coefficient of the soft magnetic layer 132. In some embodiments, the hard magnetic layer 136 has a magnetic thermal stability coefficient that is at least three times that of the soft magnetic layer 136.

The oxide coupling layer 134 is generally nonmagnetic and moderates the magnetic interaction between the soft magnetic layer 132 and the hard magnetic layer 136. The oxide coupling layer 134 may include at least one of MgO, MgTiO, MoO, SiO, TiO, TaO, AlO, RuO, NiO, HfO, and IrO. In some embodiments, the oxide coupling layer 134 consists at least one of MgO, MgTiO, MoO, SiO, TiO, TaO, AlO, RuO, NiO, HfO, and IrO. The thickness of the oxide coupling layer 134 may be selected in order to achieve the desired magnitude of the exchange coupling between the layers 132 and 136. The oxide coupling layer 134 may be sufficiently thick that the soft magnetic layer 132 and the hard magnetic layer 136 are magnetically coupled with a characteristic exchange energy density of at least 0.2 erg/cm$^2$ and not more than 0.8 erg/cm$^2$. In some such embodiments, the characteristic exchange energy density is at least 0.3 erg/cm$^2$ and not more than 0.5 erg/cm$^2$. However, other exchange field and exchange energy densities are possible in other embodiments.

The thickness and material(s) used in the oxide coupling layer 134 may be selected to tailor the magnetic coupling between the layers 132 and 136. The desired exchange field may achieved for an oxide coupling layer 134 having a thickness of least five Angstroms and not more than fifteen Angstroms. In some embodiments, the oxide coupling layer 134, such as an MgO oxide coupling layer 134, is at least six Angstroms thick and not more than nine Angstroms thick for the desired exchange field. Particularly at the lower end of this thickness range, the oxide coupling layer 134 may not be continuous. It is also noted that the oxide coupling layer 134 may be desired to be electrically conductive.

The magnetic junction 100B may share the benefits of the magnetic junction 100A. The FOM for the magnetic junction 100B may be increased. In some cases, an improvement of at least a factor of two in the FOM may be achieved, particularly for the magnetic coupling in the ranges described above. The increase in the FOM may be achieved without increased damping. The oxide coupling layer 134 may also enhance the PMA of the magnetic layers 132 and 136. Performance of the magnetic junction 100B may thus be improved.

Figure 3:
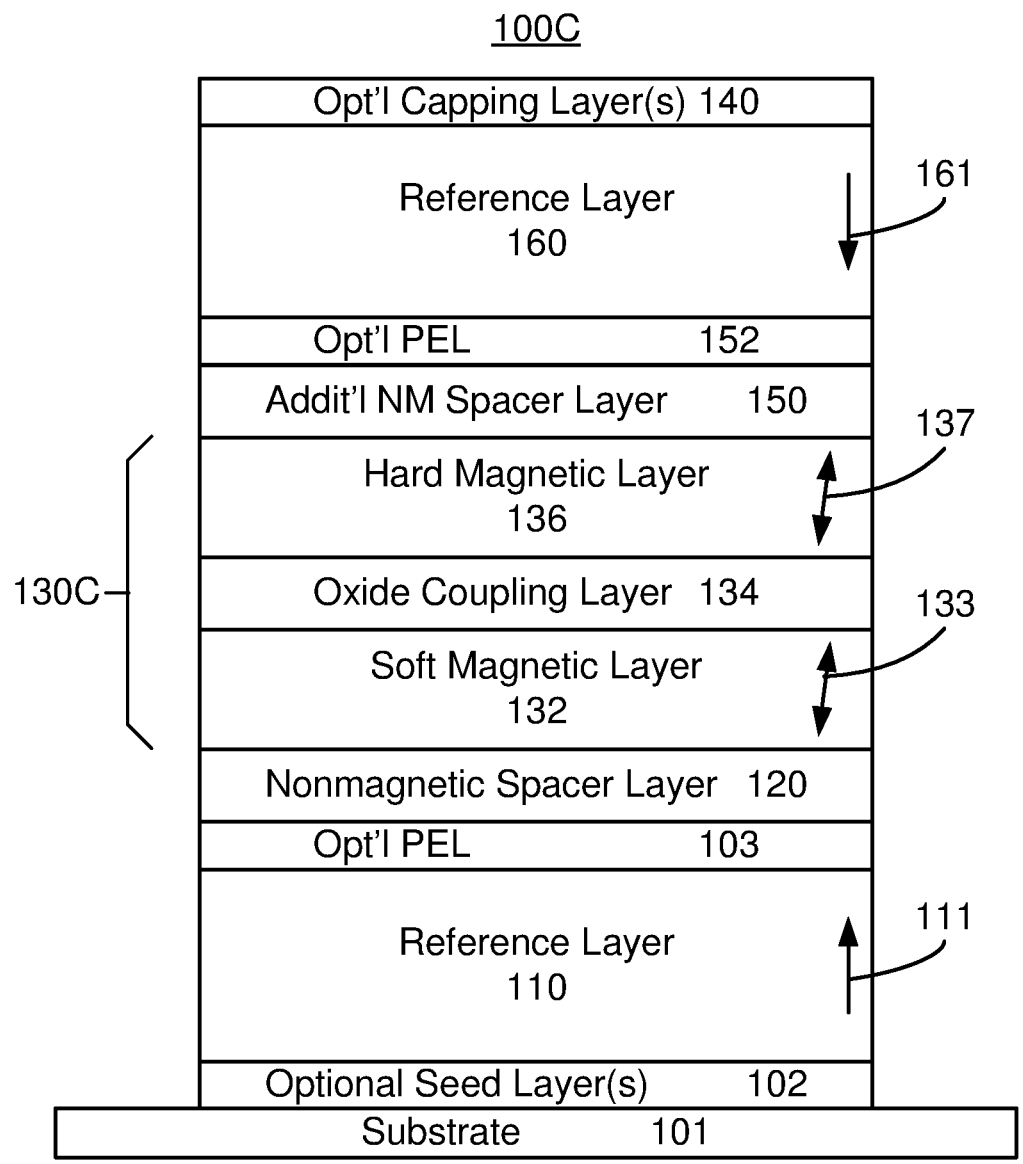
FIG. 3 depicts another exemplary embodiment of a magnetic junction usable in a magnetic devices and having a hybrid free layer including an oxide coupling layer.

FIG. 3 depicts another exemplary embodiment of a magnetic junction 100C usable in a magnetic devices such as a magnetic memory programmable using spin transfer torque and having a hybrid free layer. For clarity, FIG. 3 is not to scale. The magnetic junction 100C is analogous to the magnetic junction(s) 100A and/or 100B. Consequently, similar components have analogous labels. For example, the magnetic junction 100C includes a reference layer 110, an optional PEL 103, a nonmagnetic spacer layer 120, and hybrid free layer 130C that are analogous to the reference layer 110, optional PEL 103, nonmagnetic spacer layer 120 and hybrid free layer 130A/130B, respectively. These layers 110, 103, 120 and 130C have an analogous structure and function to the layers 110, 102, 120 and 130A/130B, respectively, depicted in FIGS. 1 and 2. For example, the reference layer 110 and the free layer 130C may each have a perpendicular magnetic anisotropy that exceeds the out-of-plane demagnetization energy. Thus, the magnetic moments 111, 133 and 137 may be stable perpendicular-to-plane or canted from perpendicular-to-plane, as shown. Also shown are optional seed layer(s) 102 and optional capping layer(s) 140 that are analogous to the seed layer(s) 102 and capping layer(s) 140 depicted in FIGS. 1 and 2. However, these seed layer(s) 102 and capping layer(s) 140 may be configured for other purposes because they are adjacent to different layers than for the magnetic junctions 100A and 100B. In other embodiments, the PEL 103 may be omitted or additional PELs may be employed, as shown. The substrate 101 on which the magnetic junction 100C is formed resides below the seed layers. A bottom contact and a top contact are not shown but may be formed.

The magnetic junction 100C is also configured to allow the free layer magnetic moments 133 and 137 to be switched between stable magnetic states using a write current passed through the magnetic junction 100C. Thus, the free layer 130C is switchable utilizing spin transfer torque when a write current is driven through the magnetic junction 100C in a CPP direction. The direction of the magnetic moments 133 and 137 of the free layer 130C may be read by driving a read current through the magnetic junction 100C.

However, the magnetic junction 100C is a dual magnetic junction. Consequently, the magnetic junction 100C also includes an additional nonmagnetic spacer layer 150 and an additional reference layer 160. Also shown is an optional additional PEL 152 that may be omitted in some embodiments. The optional PEL 152 is analogous to the optional PEL 103. The additional nonmagnetic spacer layer 150 is analogous to the nonmagnetic spacer layer 120. Thus, the nonmagnetic spacer layer(s) 150 may be a tunneling barrier layer, such as a crystalline MgO tunneling barrier with a (100) orientation. The thickness of the nonmagnetic spacer layer 150 may be analogous to the thickness of the nonmagnetic spacer layer 120. However, the thicknesses are generally different. In other embodiments, the nonmagnetic spacer layer 150 may be formed of additional and/or other material(s) including but not limited to conductors. The additional reference layer 160 is analogous to the reference layer 110. The reference layer 110 is shown as being a simple, single layer but may be a multilayer. The reference layer 160 has a high perpendicular magnetic anisotropy and a magnetic moment 161 that is stable out-of-plane. In the embodiment shown, the magnetic moments 161 and 111 are antiparallel. This configuration may reduce the magnitude of the write current required to switch the magnetic moments 133 and 137. However, in other embodiments, the magnetic moments 161 and 111 may be oriented differently, including but not limited to being parallel. In alternate embodiments, the reference layer 160 may have the magnetic moment 161 in plane.

The hybrid free layer 130C includes two magnetic layers 132 and 136 and an oxide coupling layer 134. The magnetic thermal stability coefficients, $\Delta_s$ and $\Delta_h$, of the hybrid free layer 130C are analogous to those described above. The soft magnetic layer 132 has a $\Delta_s$ that is not more than thirty at room/standby temperature. In some such embodiments, $\Delta_s$ is not more than twenty room/standby temperature. In some cases, $\Delta_s$ may be less than twenty at such temperatures. The hard magnetic layer 136 has a magnetic thermal stability coefficient, $\Delta_h$, that is at least twice the magnetic thermal stability coefficient of the soft magnetic layer 132. In some embodiments, the hard magnetic layer 136 has a magnetic thermal stability coefficient that is at least three times that of the soft magnetic layer 136.

The oxide coupling layer 134 is generally nonmagnetic and moderates the magnetic interaction between the soft magnetic layer 132 and the hard magnetic layer 136. The oxide coupling layer 134 may include at least one of MgO, MgTiO, MoO, SiO, TiO, TaO, AlO, RuO, NiO, HfO, and IrO. In some embodiments, the oxide coupling layer 134 consists at least one of MgO, MgTiO, MoO, SiO, TiO, TaO, AlO, RuO, NiO, HfO, and IrO. The thickness of the oxide coupling layer 134 may be selected in order to achieve the desired magnitude of the exchange coupling between the layers 132 and 136. The oxide coupling layer 134 may be sufficiently thick that the soft magnetic layer 132 and the hard magnetic layer 136 are magnetically coupled with a characteristic exchange energy density of at least 0.2 erg/cm$^2$ and not more than 0.8 erg/cm$^2$. In some such embodiments, the characteristic exchange energy density is at least 0.3 erg/cm$^2$ and not more than 0.5 erg/cm$^2$. However, other exchange field and exchange energy densities are possible in other embodiments.

The thickness and material(s) used in the oxide coupling layer 134 may be selected to tailor the magnetic coupling between the layers 132 and 136. The desired exchange field may achieved for an oxide coupling layer 134 having a thickness of least five Angstroms and not more than fifteen Angstroms. In some embodiments, the oxide coupling layer 134, such as an MgO oxide coupling layer 134, is at least six Angstroms thick and not more than nine Angstroms thick for the desired exchange field. Particularly at the lower end of this thickness range, the oxide coupling layer 134 may not be continuous. The oxide coupling layer 134 may also be desired to be electrically conductive.

The magnetic junction 100C may share the benefits of the magnetic junctions 100A and/or 100B. The FOM for the magnetic junction 100C may be increased. In some cases, an improvement of at least a factor of two in the FOM may be achieved. The increase in the FOM may be achieved without increased damping. The oxide coupling layer 134 may also enhance the PMA of the magnetic layers 132 and 136. Performance of the magnetic junction 100C may thus be improved.

Figure 4:
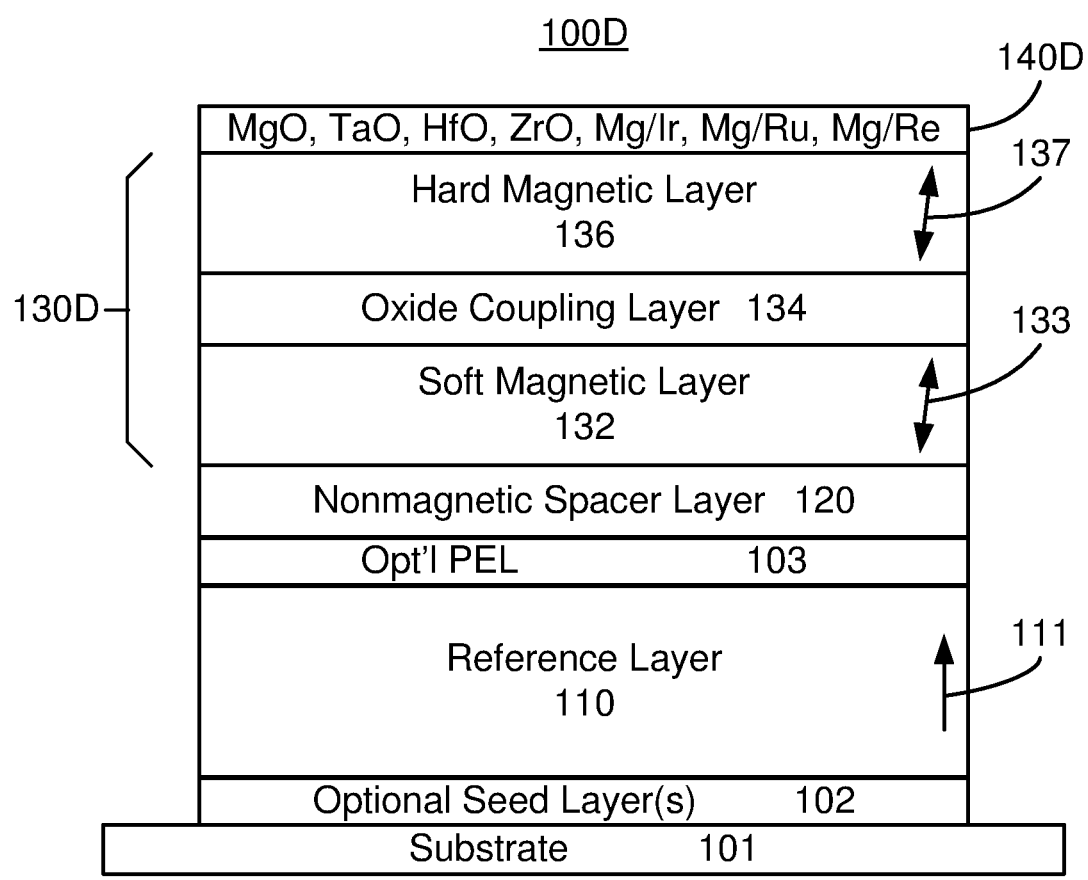
FIG. 4 depicts another exemplary embodiment of a magnetic junction usable in a magnetic devices and having a hybrid free layer including an oxide coupling layer.

FIG. 4 depicts another exemplary embodiment of a magnetic junction 100D usable in a magnetic devices such as a magnetic memory programmable using spin transfer torque and having a hybrid free layer. For clarity, FIG. 4 is not to scale. The magnetic junction 100D is analogous to the magnetic junction(s) 100A, 100B and/or 100C. Consequently, similar components have analogous labels. For example, the magnetic junction 100D includes a reference layer 110, an optional PEL 103, a nonmagnetic spacer layer 120, and hybrid free layer 130D that are analogous to the reference layer 110, optional PEL 103, nonmagnetic spacer layer 120 and hybrid free layer 130A/130B/130C, respectively. These layers 110, 103, 120 and 130D have an analogous structure and function to the layers 110, 102, 120 and 130A/130B/130C, respectively, depicted in FIGS. 1-3. For example, the reference layer 110 and the free layer 130D may each have a perpendicular magnetic anisotropy that exceeds the out-of-plane demagnetization energy. Thus, the magnetic moments 111, 133 and 137 may be stable perpendicular-to-plane or canted from perpendicular-to-plane, as shown. Also shown are optional seed layer(s) 102 and optional capping layer(s) 140D that are analogous to the seed layer(s) 102 and capping layer(s) 140 depicted in FIGS. 1-3. In other embodiments, the PEL 103 may be omitted or additional PELs may be employed. The substrate 101 on which the magnetic junction 100D is formed resides below the seed layers. A bottom contact and a top contact are not shown but may be formed. The magnetic junction 100D is also configured such that the free layer 130D is switchable utilizing spin transfer torque when a write current is driven through the magnetic junction 100D in a CPP direction. The free layer 130D may be read by driving a read current through the magnetic junction 100D.

The hybrid free layer 130D includes two magnetic layers 132 and 136 and an oxide coupling layer 134. The magnetic thermal stability coefficients, $\Delta_s$ and $\Delta_h$, of the hybrid free layer 130D are analogous to those described above. The oxide coupling layer 134 is generally nonmagnetic and moderates the magnetic interaction between the soft magnetic layer 132 and the hard magnetic layer 136. The oxide coupling layer 134 may include at least one of MgO, MgTiO, MoO, SiO, TiO, TaO, AlO, RuO, NiO, HfO and IrO. In some embodiments, the oxide coupling layer 134 consists at least one of MgO, MgTiO, MoO, SiO, TiO, TaO, AlO, RuO, NiO, HfO and IrO. The thickness of the oxide coupling layer 134 may be selected in order to achieve the desired magnitude of the exchange coupling between the layers 132 and 136, as described above.

The capping layer(s) 140D are expressly shown as including at least one of an MgO layer, a TaO, a HfO, a ZrO layer, an Mg/Ir layer, an Mg/Ru layer and an Mg/Re layer. Although termed Mg/Ir, Mg/Ru and Mg/Re layers, each of these layers is a bilayer as deposited, but undergoes a plasma treatment and an oxidation step. An in-situ anneal, such as a rapid thermal anneal, may be performed between the plasma treatment and oxidation steps. Further, the Mg, Ir, Ru and Re layers may be thin. In some embodiments, these layers may be on the order of one through three Angstroms. For example, the target thickness for each layer may be two Angstroms. However, after the plasma treatment and oxidation, it is believed that the Mg and Ir/Ru/Re not only intermix but are also oxidized. The Mg/Ir, Mg/Re and Mg/Ru layer may be used only for embodiments in the magnetic junction is a bottom pinned magnetic junction analogous to the magnetic junction 100D. Use of such capping layers 140D may increase the magnetic hardness and/or PMA of the hard magnetic layer 136.

The magnetic junction 100D may share the benefits of the magnetic junctions 100A, 100B and/or 100C. The FOM for the magnetic junction 100D may be increased. In some cases, an improvement of at least at least a factor of two in the FOM may be achieved. The increase in the FOM may be achieved without significantly increasing damping. The oxide coupling layer 134 may also increase the PMA of the magnetic layers 132 and 136. The capping layer(s) 140D may also be used to improve the magnetic properties of the hard magnetic layer 136. Performance of the magnetic junction 100D may thus be improved.

Figure 5:
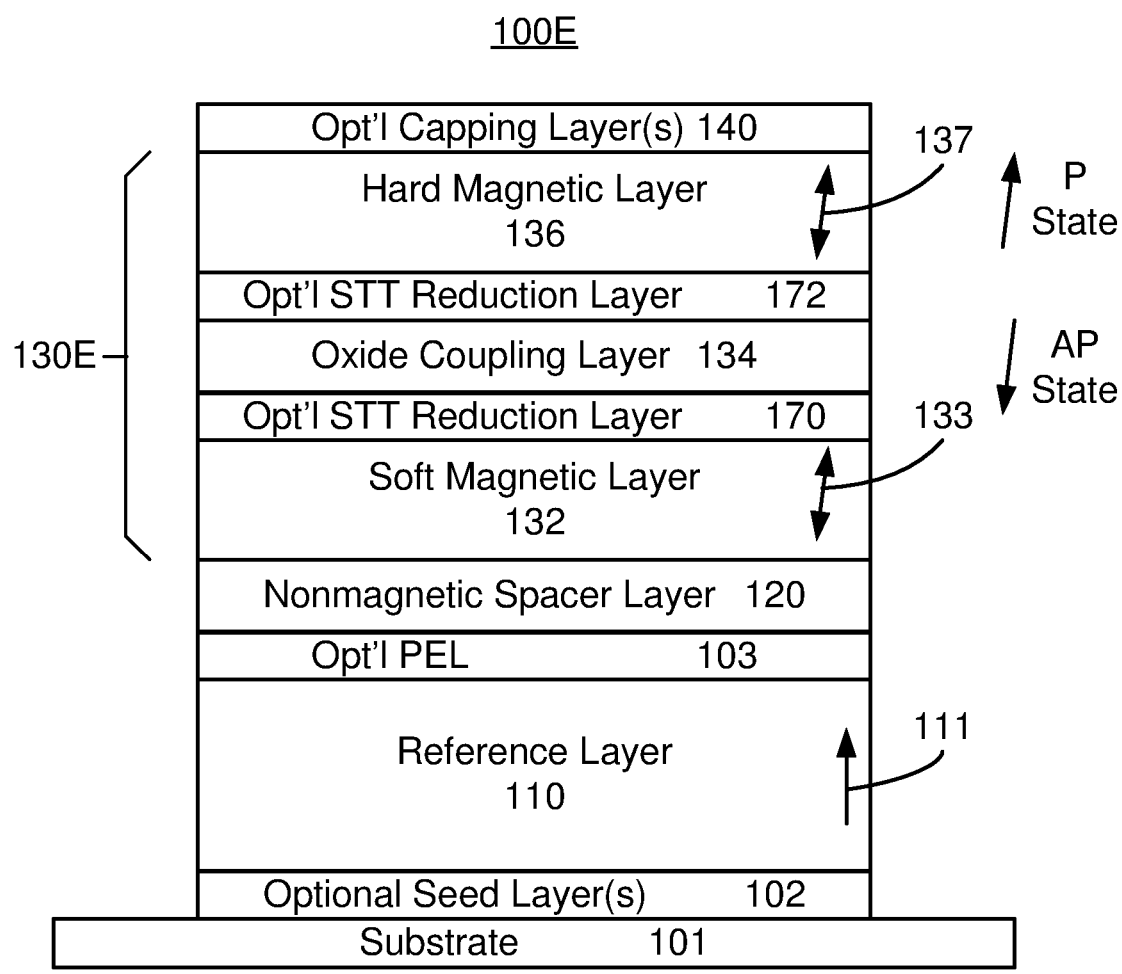
FIG. 5 depicts another exemplary embodiment of a magnetic junction usable in a magnetic devices and having a hybrid free layer including an oxide coupling layer.

FIG. 5 depicts another exemplary embodiment of a magnetic junction 100E usable in a magnetic devices such as a magnetic memory programmable using spin transfer torque and having a hybrid free layer. For clarity, FIG. 5 is not to scale. The magnetic junction 100E is analogous to the magnetic junction(s) 100A, 100B, 100C and/or 100D. Consequently, similar components have analogous labels. For example, the magnetic junction 100E includes a reference layer 110, an optional PEL 103, a nonmagnetic spacer layer 120, and hybrid free layer 130E that are analogous to the reference layer 110, optional PEL 103, nonmagnetic spacer layer 120 and hybrid free layer 130A/130B/130C/130D, respectively. These layers 110, 103, 120 and 130E have an analogous structure and function to the layers 110, 102, 120 and 130A/130B/130C/130D, respectively, depicted in FIGS. 1-4. For example, the reference layer 110 and the free layer 130E may each have a perpendicular magnetic anisotropy that exceeds the out-of-plane demagnetization energy. Thus, the magnetic moments 111, 133 and 137 may be stable perpendicular-to-plane or canted from perpendicular-to-plane, as shown. Also shown are optional seed layer(s) 102 and optional capping layer(s) 140 that are analogous to the seed layer(s) 102 and capping layer(s) 140/140D depicted in FIGS. 1-4. In other embodiments, the PEL 103 may be omitted or additional PELs may be employed. The substrate 101 on which the magnetic junction 100E is formed resides below the seed layers. A bottom contact and a top contact are not shown but may be formed. The magnetic junction 100E is also configured such that the free layer 130E is switchable utilizing spin transfer torque when a write current is driven through the magnetic junction 100E in a CPP direction. The free layer 130E may be read by driving a read current through the magnetic junction 100E.

The hybrid free layer 130E includes two magnetic layers 132 and 136 and an oxide coupling layer 134. The magnetic thermal stability coefficients, $\Delta_s$ and $\Delta_h$, of the hybrid free layer 130E are analogous to those described above. The oxide coupling layer 134 is generally nonmagnetic and moderates the magnetic interaction between the soft magnetic layer 132 and the hard magnetic layer 136. The oxide coupling layer 134 may include at least one of MgO, MgTiO, MoO, SiO, TiO, TaO, AlO, RuO, NiO, HfO and IrO. In some embodiments, the oxide coupling layer 134 consists at least one of MgO, MgTiO, MoO, SiO, TiO, TaO, AlO, RuO, NiO, HfO and IrO. The thickness of the oxide coupling layer 134 may be selected in order to achieve the desired magnitude of the exchange coupling between the layers 132 and 136, as described above.

The hybrid free layer 130E of the magnetic junction 100E also includes spin transfer torque (STT) reduction layer(s) 170 and 172. One or both of the STT reduction layers 170 and/or 172 may be present. The STT reduction layers 170 and 172 may reduce any STT across the oxide coupling layer 134, between the magnetic layers 132 and 136 of the free layer 130E. Because they adjoin a magnetic layer (e.g. magnetic layers 132 or 136), the STT reduction layers 170 and 172 may be magnetic or nonmagnetic. For example, nonmagnetic material(s) such as Ru, Al, Ta, Ti, W, Mg, Cr, V, Mo, Si, Zn, Ga, Ge, Zr and/or Nb may be used in the STT reduction layer(s) 170 and/or 172. Magnetic material(s) such as Ni might be present in the STT reduction layer(s) 170 and/or 172. However, because it may reduce PMA, Ni may not be desired to be used for the STT reduction layer 172. Use of the STT reduction layer(s) 170 and/or 172 may reduce the STT switching efficiency for the free layer 130E. The STT reduction layers 170 and 172 are generally desired to be thin. For example, the layers 170 and 172 may be at least one Angstrom and not more than three Angstroms thick. Other material(s) and/or thicknesses may be used for the STT reduction layer(s) 170 and/or 172 as long as the desired coupling across the oxide coupling layer 134 may be substantially maintained.

The STT reduction layer(s) 170 and/or 172 may be used to reduce an asymmetry in switching the hybrid free layer 130E. A parallel (P) state for the magnetic junction 100E occurs when the magnetic moments 133 and 137 of the hybrid free layer 130E are substantially parallel to the magnetic moment 111 of the reference layer 110 (i.e. moments 133 and 137 oriented toward the top of the page). An antiparallel (AP) state occurs when the magnetic moments 133 and 137 of the hybrid free layer 130E are substantially antiparallel to the magnetic moment 111 of the reference layer 110 (moments 133 and 137 oriented toward the bottom of the page). A magnetic junction may require a higher switching current to be driven through the magnetic junction when switching from the P state to the AP than when switching from the AP state to the P state. This asymmetry may occur because STT occurs across the oxide coupling layer 134. A spin polarized current from the hard magnetic layer 136 counteracts switching of the soft magnetic layer 132 when switching from the P to the AP state. Conversely, a spin polarized current from the hard magnetic layer 136 aids in switching of the soft magnetic layer 132 when switching from the AP state to the P state. Thus, an asymmetry in the switching currents may arise. The STT reduction layers 170 and 172 each may mitigate this STT across the oxide coupling layer 134. Consequently, the asymmetry in switching the magnetic junction 100E may be reduced.

The magnetic junction 100E may share the benefits of the magnetic junctions 100A, 100B, 100C and/or 100D. The FOM for the magnetic junction 100E may be increased. In some cases, an improvement of at least a factor of two in the FOM may be achieved. The increase in the FOM may be achieved without significantly increasing damping. The oxide coupling layer 134 may also increase the PMA of the magnetic layers 132 and 136. The STT reduction layer(s) 170 and/or 172 may improve the symmetry in switching for the magnetic junction 100E. Performance of the magnetic junction 100E may thus be improved.

Figure 6:
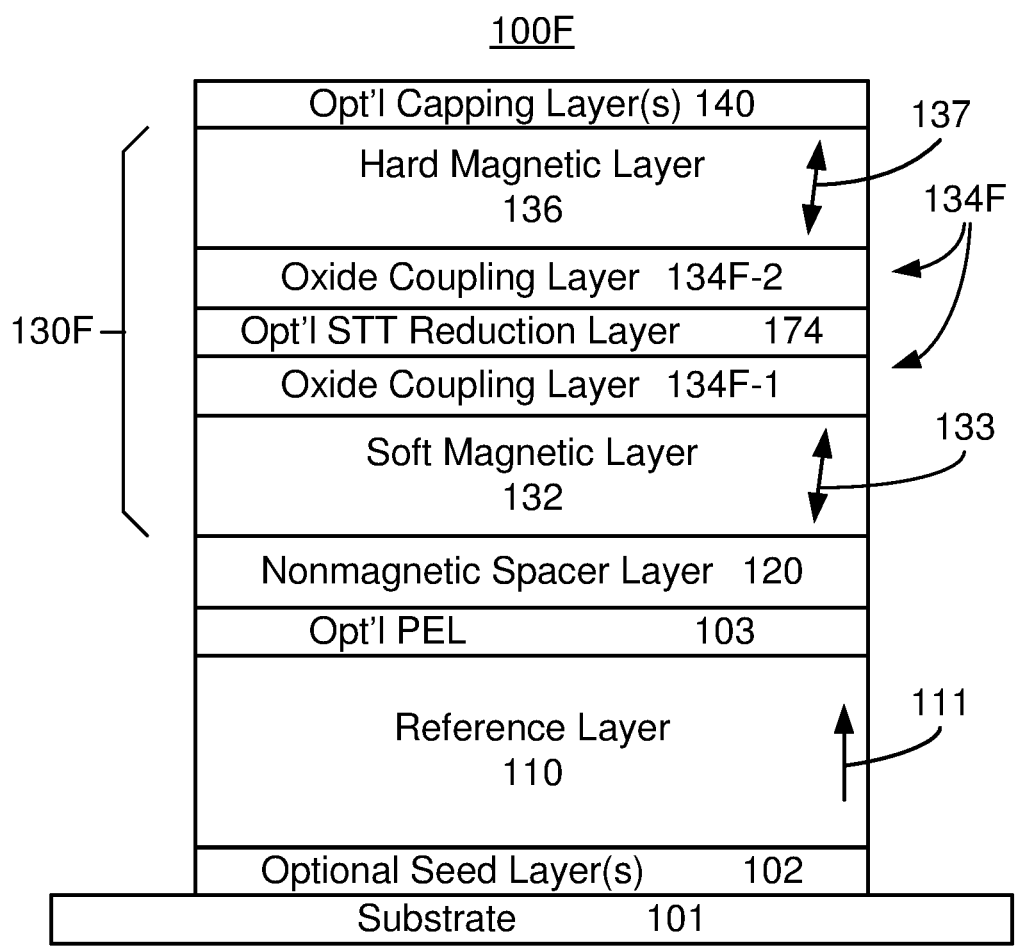
FIG. 6 depicts another exemplary embodiment of a magnetic junction usable in a magnetic devices and having a hybrid free layer including an oxide coupling layer.

FIG. 6 depicts another exemplary embodiment of a magnetic junction 100F usable in a magnetic devices such as a magnetic memory programmable using spin transfer torque and having a hybrid free layer. For clarity, FIG. 6 is not to scale. The magnetic junction 100F is analogous to the magnetic junction(s) 100A, 100B, 100C, 100D and/or 100E. Consequently, similar components have analogous labels. For example, the magnetic junction 100F includes a reference layer 110, an optional PEL 103, a nonmagnetic spacer layer 120, and hybrid free layer 130F that are analogous to the reference layer 110, optional PEL 103, nonmagnetic spacer layer 120 and hybrid free layer 130A/130B/130C/130D/130E, respectively. These layers 110, 103, 120 and 130E have an analogous structure and function to the layers 110, 102, 120 and 130A/130B/130C/130D/130E, respectively, depicted in FIGS. 1-5. For example, the reference layer 110 and the free layer 130F may each have a perpendicular magnetic anisotropy that exceeds the out-of-plane demagnetization energy. Thus, the magnetic moments 111, 133 and 137 may be stable perpendicular-to-plane or canted from perpendicular-to-plane. Also shown are optional seed layer(s) 102 and optional capping layer(s) 140 that are analogous to the seed layer(s) 102 and capping layer(s) 140/140D depicted in FIGS. 1-5. In other embodiments, the PEL 103 may be omitted or additional PELs may be employed. The substrate 101 on which the magnetic junction 100F is formed resides below the seed layers. A bottom contact and a top contact are not shown but may be formed. The magnetic junction 100F is also configured such that the free layer 130F is switchable utilizing spin transfer torque when a write current is driven through the magnetic junction 100F in a CPP direction. The free layer 130F may be read by driving a read current through the magnetic junction 100F.

The hybrid free layer 130F includes two magnetic layers 132 and 136 and an oxide coupling layer 134F. The magnetic thermal stability coefficients, $\Delta_s$ and $\Delta_h$, of the hybrid free layer 130F are analogous to those described above. The oxide coupling layer 134F is generally nonmagnetic and moderates the magnetic interaction between the soft magnetic layer 132 and the hard magnetic layer 136. The oxide coupling layer 134F may include at least one of MgO, MgTiO, MoO, SiO, TiO, TaO, AlO, RuO, NiO, HfO and IrO. In some embodiments, the oxide coupling layer 134F consists at least one of MgO, MgTiO, MoO, SiO, TiO, TaO, AlO, RuO, NiO, HfO and IrO. The thickness of the oxide coupling layer 134F may be selected in order to achieve the desired magnitude of the exchange coupling between the layers 132 and 136, as described above.

The hybrid free layer 130F of the magnetic junction 100F also includes an STT reduction layer 174 within the oxide coupling layer 134F. Thus, the oxide coupling layer 134F may be viewed as including two sub-layers 134F-1 and 134F-2. The STT reduction layer 174 may reduce any STT across the oxide coupling layer 134F, between the magnetic layers 132 and 136 of the free layer 130F. Because it is within the oxide coupling layer 134F, the STT reduction layer 174 is nonmagnetic. For example nonmagnetic material(s) such as Ru, Al, Ta, Ti, W, Mg, Cr, V, Mo, Si, Zn, Ga, Ge, Zr and/or Nb may be used in the STT reduction layer 174. In general high spin scattering material are used for the STT reduction layer 174. The STT reduction layer 174 is generally desired to be thin. For example, the layer 174 may be at least one Angstrom and not more than five Angstroms thick. Other material(s) and/or thicknesses may be used for the STT reduction layer 174 as long as the desired coupling across the oxide coupling layer 134F may be substantially maintained.

The STT reduction layer 174 may be used to reduce an asymmetry in switching the hybrid free layer 130F. Operation of the STT reduction layer 174 is thus similar to that described above for the layers 170 and 172 of the magnetic junction 100E. More specifically, the STT reduction layer 174 may mitigate the STT across the oxide coupling layer 134F that results in increased switching asymmetry. Consequently, the asymmetry in switching the magnetic junction 100F may be reduced.

The magnetic junction 100F may share the benefits of the magnetic junctions 100A, 100B, 100C, 100D and/or 100E. The FOM for the magnetic junction 100F may be increased. In some cases, an improvement of at least a factor of two in the FOM may be achieved. The increase in the FOM may be achieved without significantly increasing damping. The oxide coupling layer 134F may also increase the PMA of the magnetic layers 132 and 136. The STT reduction layer 174 may improve the symmetry in switching for the magnetic junction 100F. Performance of the magnetic junction 100F may thus be improved.

Figure 7:
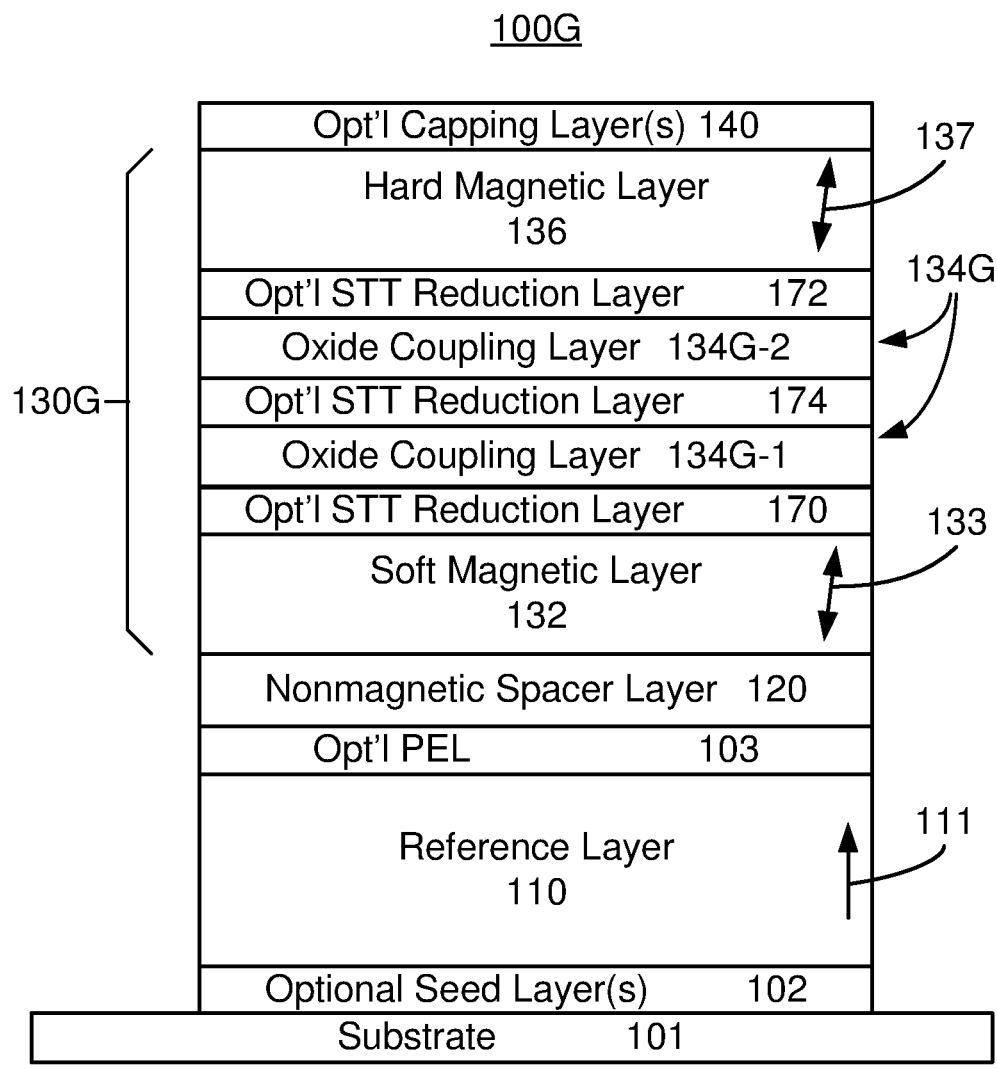
FIG. 7 depicts another exemplary embodiment of a magnetic junction usable in a magnetic devices and having a hybrid free layer including an oxide coupling layer.

FIG. 7 depicts another exemplary embodiment of a magnetic junction 100G usable in a magnetic devices such as a magnetic memory programmable using spin transfer torque and having a hybrid free layer. For clarity, FIG. 7 is not to scale. The magnetic junction 100G is analogous to the magnetic junction(s) 100A, 100B, 100C, 100D, 100E and/or 100F. Consequently, similar components have analogous labels. For example, the magnetic junction 100G includes a reference layer 110, an optional PEL 103, a nonmagnetic spacer layer 120, and hybrid free layer 130G that are analogous to the reference layer 110, optional PEL 103, nonmagnetic spacer layer 120 and hybrid free layer 130A/130B/130C/130D/130E/130F, respectively. These layers 110, 103, 120 and 130F have an analogous structure and function to the layers 110, 102, 120 and 130A/130B/130C/130D/130E/130F, respectively, depicted in FIGS. 1-6. For example, the reference layer 110 and the free layer 130G may each have a perpendicular magnetic anisotropy that exceeds the out-of-plane demagnetization energy. Thus, the magnetic moments 111, 133 and 137 may be stable perpendicular-to-plane or canted from perpendicular-to-plane, as shown. Also shown are optional seed layer(s) 102 and optional capping layer(s) 140 that are analogous to the seed layer(s) 102 and capping layer(s) 140/140D depicted in FIGS. 1-6. In other embodiments, the PEL 103 may be omitted or additional PELs may be employed. The substrate 101 on which the magnetic junction 100G is formed resides below the seed layers. A bottom contact and a top contact are not shown but may be formed. The magnetic junction 100G is also configured such that the free layer 130G is switchable utilizing spin transfer torque when a write current is driven through the magnetic junction 100G in a CPP direction. The free layer 130G may be read by driving a read current through the magnetic junction 100G.

The hybrid free layer 130G includes two magnetic layers 132 and 136 and an oxide coupling layer 134G. The magnetic thermal stability coefficients, $\Delta_s$ and $\Delta_h$, of the hybrid free layer 130G are analogous to those described above. The oxide coupling layer 134G is generally nonmagnetic and moderates the magnetic interaction between the soft magnetic layer 132 and the hard magnetic layer 136. The oxide coupling layer 134G may include at least one of MgO, MgTiO, MoO, SiO, TiO, TaO, AlO, RuO, NiO, HfO and IrO. In some embodiments, the oxide coupling layer 134G consists at least one of MgO, MgTiO, MoO, SiO, TiO, TaO, AlO, RuO, NiO, HfO and IrO. The thickness of the oxide coupling layer 134G may be selected in order to achieve the desired magnitude of the exchange coupling between the layers 132 and 136, as described above.

The hybrid free layer 130G of the magnetic junction 100G includes STT reduction layers 170, 172 and 174 within the oxide coupling layer 134G. Thus, the oxide coupling layer 134G may be viewed as including two sub-layers 134G-1 and 134G-2. The STT reduction layers 170, 172 and 174 are analogous to those described above. Use of the STT reduction layers 170, 172 and/or 174 may reduce the STT switching efficiency for the free layer 130G. Further, another number of STT reduction layers (not shown) may be included within the oxide coupling layer 134G. For example, four, five or more STT reduction layers may be employed as along as the desired magnetic coupling and other magnetic properties of the hybrid free layer 130G are maintained. In such embodiments, the oxide coupling layer 134G may be broken into more sub-layers. The STT reduction layer(s) 170, 172 and 174 may mitigate the STT across the oxide coupling layer 134G which results in increased switching asymmetry. Consequently, the symmetry in switching the magnetic junction 100G may be improved.

The magnetic junction 100G may share the benefits of the magnetic junctions 100A, 100B, 100C, 100D, 100E and/or 100F. The FOM for the magnetic junction 100G may be increased. In some cases, an improvement of at least a factor of two in the FOM may be achieved. The increase in the FOM may be achieved without significantly increasing damping. The oxide coupling layer 134G may also increase the PMA of the magnetic layers 132 and 136. The STT reduction layer(s) 170, 172 and/or 174 may reduce the asymmetry in switching for the magnetic junction 100G. Performance of the magnetic junction 100G may thus be improved.

Figure 8:
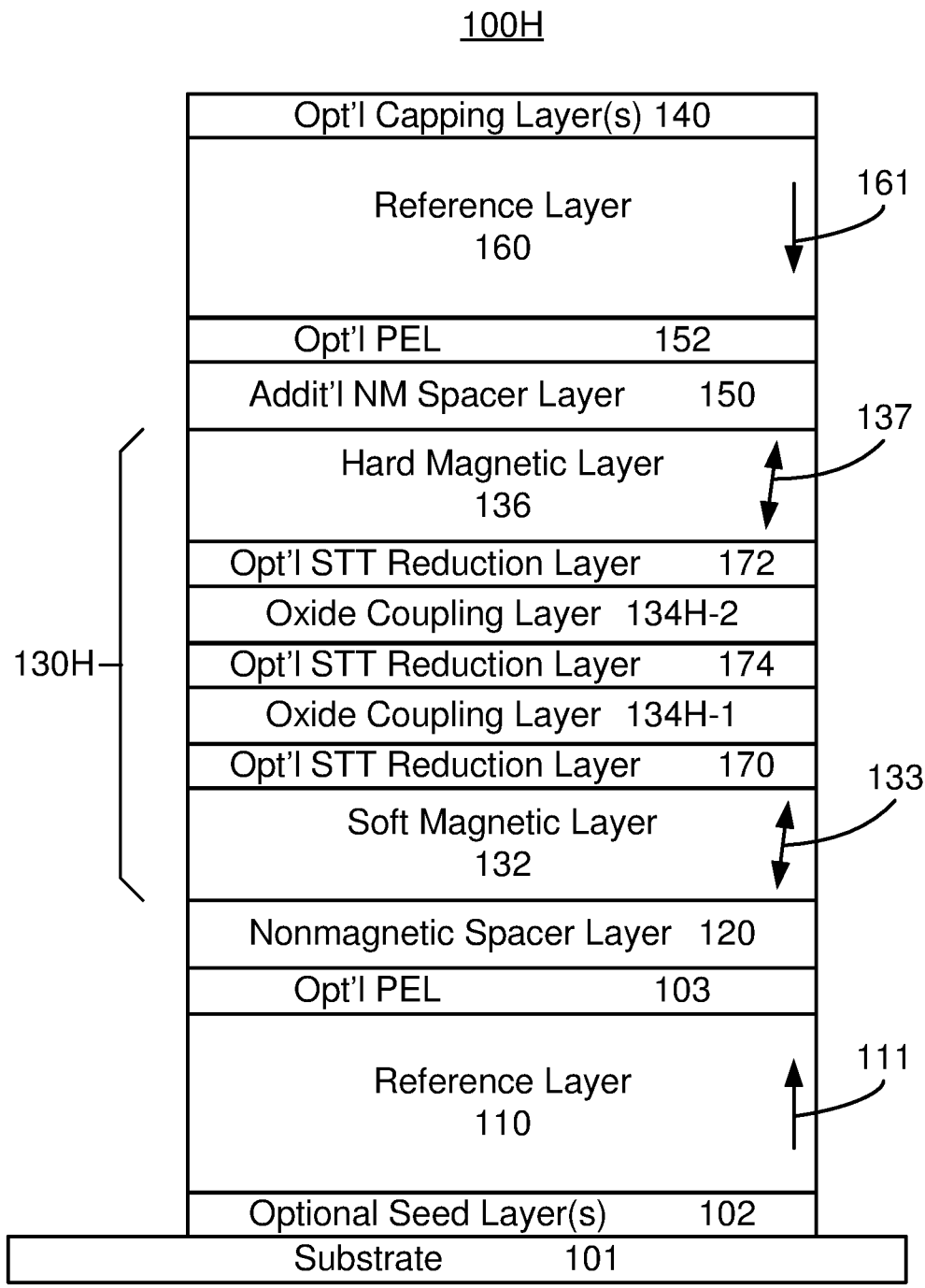
FIG. 8 depicts another exemplary embodiment of a magnetic junction usable in a magnetic devices and having a hybrid free layer including an oxide coupling layer.

FIG. 8 depicts another exemplary embodiment of a magnetic junction 100H usable in a magnetic devices such as a magnetic memory programmable using spin transfer torque and having a hybrid free layer. For clarity, FIG. 8 is not to scale. The magnetic junction 100H is analogous to the magnetic junction(s) 100A, 100B, 100C, 100D, 100E, 100F and/or 100G. Consequently, similar components have analogous labels. For example, the magnetic junction 100H includes a reference layer 110, an optional PEL 103, a nonmagnetic spacer layer 120, and hybrid free layer 130H that are analogous to the reference layer 110, optional PEL 103, nonmagnetic spacer layer 120 and hybrid free layer 130A/130B/130C/130D/130E/130F/130G, respectively. These layers 110, 103, 120 and 130F have an analogous structure and function to the layers 110, 102, 120 and 130A/130B/130C/130D/130E/130F/130G, respectively, depicted in FIGS. 1-7. For example, the reference layer 110 and the free layer 130H may each have a perpendicular magnetic anisotropy that exceeds the out-of-plane demagnetization energy. Thus, the magnetic moments 111, 133 and 137 may be stable perpendicular-to-plane or canted from perpendicular-to-plane, as shown. Also shown are optional seed layer(s) 102 and optional capping layer(s) 140 that are analogous to the seed layer(s) 102 and capping layer(s) 140/140D depicted in FIGS. 1-7. In other embodiments, the PEL 103 may be omitted or additional PELs may be employed. The substrate 101 on which the magnetic junction 100H is formed resides below the seed layers. A bottom contact and a top contact are not shown but may be formed. The magnetic junction 100H is also configured such that the free layer 130H is switchable utilizing spin transfer torque when a write current is driven through the magnetic junction 100H in a CPP direction. The free layer 130H may be read by driving a read current through the magnetic junction 100H.

The magnetic junction 100H is a dual magnetic junction. Consequently, the magnetic junction 100H also includes an additional nonmagnetic spacer layer 150, an optional additional PEL 152 and an additional reference layer 160 having a magnetic moment 161. These layers 150, 152 and 160 are analogous to the layers 150, 152 and 160 described above.

The hybrid free layer 130H includes two magnetic layers 132 and 136 and an oxide coupling layer 134H. The magnetic thermal stability coefficients, $\Delta_s$ and $\Delta_h$, of the hybrid free layer 130H are analogous to those described above. The oxide coupling layer 134H is generally nonmagnetic and moderates the magnetic interaction between the soft magnetic layer 132 and the hard magnetic layer 136. The oxide coupling layer 134H may include at least one of MgO, MgTiO, MoO, SiO, TiO, TaO, AlO, RuO, NiO, HfO and IrO. In some embodiments, the oxide coupling layer 134H consists at least one of MgO, MgTiO, MoO, SiO, TiO, TaO, AlO, RuO, NiO, HfO and IrO. The thickness of the oxide coupling layer 134H may be selected in order to achieve the desired magnitude of the exchange coupling between the layers 132 and 136, as described above.

The hybrid free layer 130H of the magnetic junction 100H includes STT reduction layers 170, 172 and 174 within the oxide coupling layer 134H. Thus, the oxide coupling layer 134H may be viewed as including two sub-layers 134H-1 and 134H-2. The STT reduction layers 170, 172 and 174 are analogous to those described above. Use of the STT reduction layers 170, 172 and/or 174 may reduce the STT switching efficiency for the free layer 130H. Further, another number of STT reduction layers (not shown) may be included within the oxide coupling layer 134H. For example, four, five or more STT reduction layers may be employed as along as the desired magnetic coupling and other magnetic properties of the hybrid free layer 130H are maintained. In such embodiments, the oxide coupling layer 134H may be broken into more sub-layers. The STT reduction layer(s) 170, 172 and 174 may mitigate the STT across the oxide coupling layer 134H.

Dual magnetic junctions such as the magnetic junction 100H may have a voltage asymmetry. The currents driven through the magnetic junction 100H for P state to AP state switching and AP state to P state switching may be substantially the same. However, the required voltage may be different for write currents in different direction through the magnetic junction 100H. This may be due at least in part to the difference in resistances in the P and AP states. By tailoring the number and properties of the STT reduction layer(s) 170, 172 and/or 174 this asymmetry may be adjusted. Consequently, the symmetry in switching the magnetic junction 100H may be improved.

The magnetic junction 100H may share the benefits of the magnetic junctions 100A, 100B, 100C, 100D, 100E, 100F and/or 100G. The FOM for the magnetic junction 100H may be increased. In some cases, an improvement of at least a factor of two in the FOM may be achieved. The increase in the FOM may be achieved without significantly increasing damping. The oxide coupling layer 134H may also increase the PMA of the magnetic layers 132 and 136. The STT reduction layer(s) 170, 172 and/or 174 may be used to tailor the asymmetry in switching for the magnetic junction 100H. Performance of the magnetic junction 100H may thus be improved.

Various features have been described with respect to the magnetic junctions 100A, 100B, 100C, 100D, 100E, 100F, 100G and/or 100H. One of ordinary skill in the art will recognize that these features may be combined in manner(s) not shown and which are not inconsistent with the devices and methods described herein.

Figure 9:
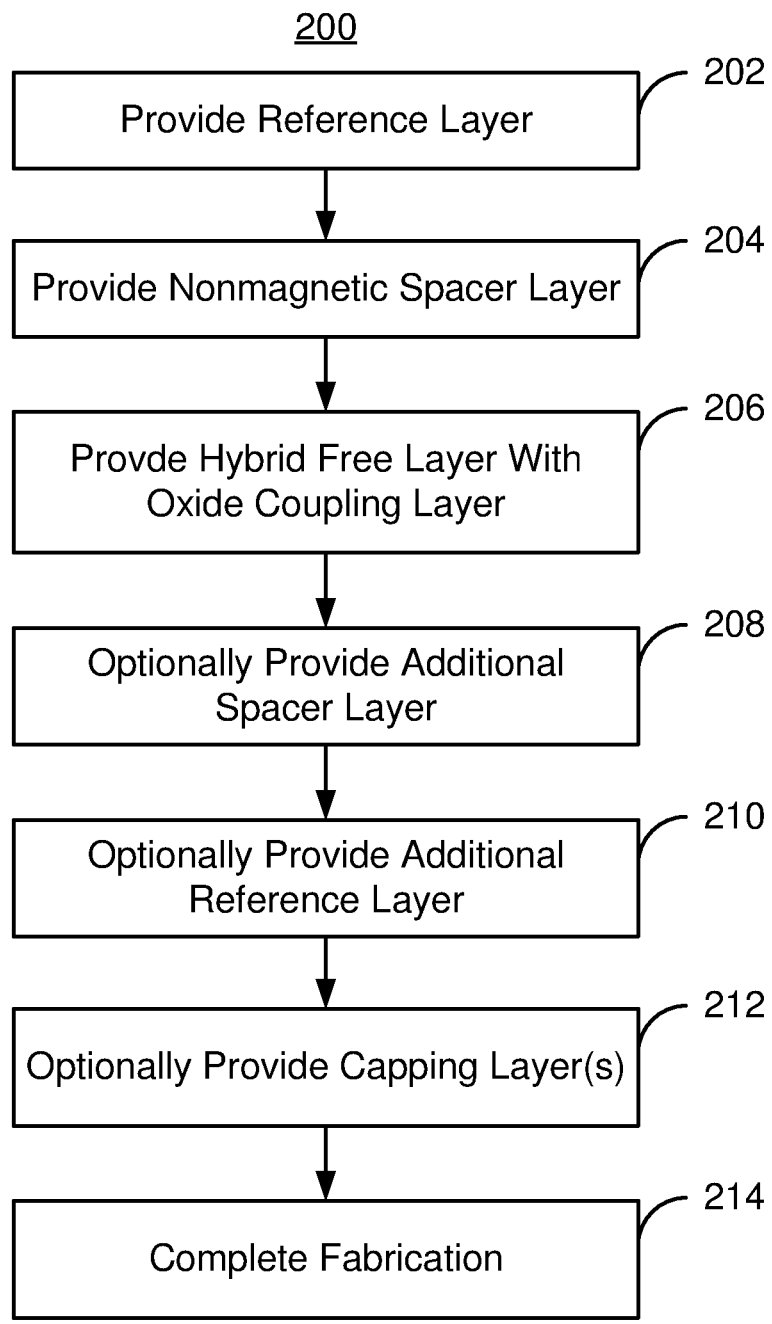
FIG. 9 is a flow chart depicting an exemplary embodiment of a method for providing a magnetic junction usable in a magnetic devices such as a magnetic memory programmable using spin transfer torque and having a hybrid free layer including an oxide coupling layer.

FIG. 9 is a flow chart depicting an exemplary embodiment of a method 200 for providing a layer for magnetic junction usable in a magnetic device and including a hybrid free layer having an oxide coupling layer. For simplicity, some steps may be omitted, performed in another order, include sub-steps and/or combined. Further, the method 200 start after other steps in forming a magnetic memory have been performed. The method 200 is described in the context of the magnetic junctions 100A, 100B, 100C, 100D, 100E, 100F, 100G and/or 100H. However the method 200 may be used in forming other magnetic junction(s). Further, multiple magnetic junctions may be simultaneously fabricated.

The reference layer 110 is provided, via step 202. Step 202 may include depositing the desired material(s) and/or layer(s) for the reference layer. Step 202 may also include providing optional PEL 103. In some embodiments, all layers for the magnetic junction(s) 100A, 100B, 100C, 100D, 100E, 100F, 100G and/or 100H are deposited prior to defining the edges of the magnetic junction(s) 100A, 100B, 100C, 100D, 100E, 100F, 100G and/or 100H. In other embodiments, the edges of one or more layers may be individually defined. As described herein, providing a layer of the magnetic junction encompasses either or both of these possibilities.

The nonmagnetic spacer layer 120 is provided, via step 204. Step 204 may thus include depositing a conductive or insulating layer. Step 204 might also include depositing a conductive layer, such as Mg, and oxidizing the layer.

The hybrid free layer 130A, 130B, 130C, 130D, 130E, 130F, 130G and/or 130H is provided, via step 206. Step 206 may include providing multiple layers 132, 134/134F/134G/134H and 136. Step 206 may also include providing STT reduction layer(s) 170, 172 and/or 174. The order in which steps 202, 204 and 206 are performed depends upon whether the magnetic junction being formed is a top pinned magnetic junction or a bottom pinned magnetic junction. For a bottom pinned magnetic junction, step 202 is performed first. For a top pinned magnetic junction, step 206 is performed first.

An additional nonmagnetic spacer layer 150 is optionally provided, via step 208. Step 208 may be performed in an analogous manner to step 204. An optional reference layer 160 is provided, via step 210. Step 210 may also include providing a PEL 152. Step 210 may be analogous to step 202. Steps 208 and 210 may be performed for fabrication of a dual magnetic junction.

The capping layer(s) 140/140D are optionally provided, via step 212. Step 212 may include providing an MgO or TaO layer. In other embodiments, step 212 may include depositing a Mg/Ir, Mg/Re and/or Mg/Ru bilayer, plasma treating the bilayer and performing an oxidation step. This may occur for a bottom pinned magnetic junction which utilizes an Mg/Ir, Mg/Re and/or Mg/Ru capping layer.

Fabrication of the magnetic junction(s) 100A, 100B, 100C, 100D, 100E, 100F, 100G and/or 100H is completed, via step 214.

Using the method 200, the magnetic junction(s) 100A, 100B, 100C, 100D, 100E, 100F, 100G and/or 100H may be formed. The hybrid free layers 130A, 130B, 130C, 130D, 130E, 130F, 130G and/or 130H may be fabricated with the desired oxide coupling layers 134, 134F, 134G and/or 134H. As a result, a magnetic junction having free layer(s) with improved switching characteristics may be achieved.

Figure 10:
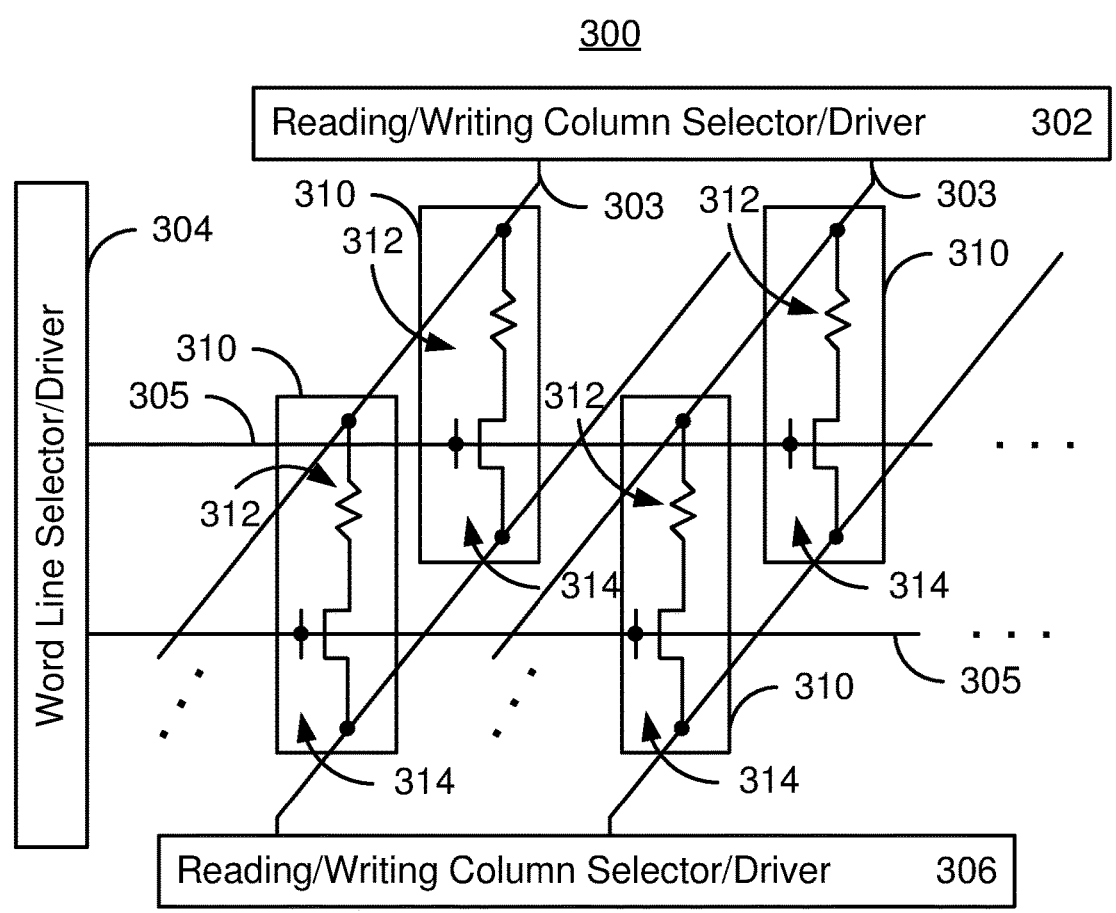
FIG. 10 depicts an exemplary embodiment of a memory utilizing magnetic junctions in the memory element(s) of the storage cell(s).

FIG. 10 depicts an exemplary embodiment of a memory 300 that may use one or more of the magnetic junctions 100A, 100B, 100C, 100D, 100E, 100F, 100G, 100H and/or other magnetic junction including a hybrid free layer such as the hybrid free layer 130A, 130B, 130C, 130D, 130E, 130F, 130G and/or 130H. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the 100A, 100B, 100C, 100D, 100E, 100F, 100G, 100H and/or other magnetic junction including the hybrid free layer 130A, 130B, 130C, 130D, 130E, 130F, 130G and/or 130H. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction usable in a magnetic device comprising:
    a reference layer;
    a nonmagnetic spacer layer;
    a hybrid free layer including a soft magnetic layer, a hard magnetic layer and an oxide coupling layer between the hard magnetic layer and the soft magnetic layer, the soft magnetic layer having a soft layer magnetic thermal stability coefficient of not more than thirty at least one standby temperature including room temperature, the hard magnetic layer having a hard layer magnetic thermal stability coefficient of at least twice the soft layer magnetic thermal stability coefficient at the standby temperature, the soft layer magnetic layer thermal stability coefficient being a soft magnetic layer anisotropy density multiplied by a soft magnetic layer volume divided by Boltzmann's constant and a temperature of the soft magnetic layer, the hard layer magnetic layer thermal stability coefficient being a hard magnetic layer anisotropy density multiplied by a hard magnetic layer volume divided by Boltzmann's constant and the temperature of the hard magnetic layer, the hybrid free layer being switchable between a plurality of stable magnetic states using a write current passed through the magnetic junction.

2. The magnetic junction of claim 1 wherein the magnetic junction further includes an additional nonmagnetic spacer layer and an additional reference layer, the hybrid free layer being between the nonmagnetic spacer layer and the additional nonmagnetic spacer layer, the additional nonmagnetic spacer layer being between the hybrid free layer and the additional reference layer.

3. The magnetic junction of claim 1 wherein the oxide coupling layer is configured such that the soft magnetic layer and the hard magnetic layer are magnetically coupled with a characteristic exchange energy density of at least 0.2 erg/cm$^2$ and not more than 0.8 erg/cm$^2$.

4. The magnetic junction of claim 3 wherein the characteristic exchange energy density is at least 0.3 erg/cm$^2$ and not more than 0.5 erg/cm$^2$, wherein the soft layer magnetic thermal stability coefficient is not more than twenty and wherein the soft magnetic layer is between the oxide coupling layer and the nonmagnetic spacer layer.

5. The magnetic junction of claim 3 wherein the oxide coupling layer is at least six Angstroms thick and not more than nine Angstroms thick.

6. The magnetic junction of claim 1 wherein the oxide coupling layer is at least five Angstroms thick and not more than fifteen Angstroms thick.

7. The magnetic junction of claim 1 wherein the oxide coupling layer includes at least one of MgO, MgTiO, MoO, SiO, TiO, TaO, AlO, RuO, NiO, HfO and IrO.

8. The magnetic junction of claim 1 further comprising a capping layer adjacent to the hard magnetic layer, the capping layer including at least one of an MgO layer, a HfO, ZrO, TaO layer, an Mg/Ir layer, an Mg/Ru layer and an Mg/Re layer, each of the Mg/Ir layer, Mg/Ru layer and Mg/Re layer being a bilayer as deposited and undergoing a plasma treatment, an anneal and an oxidation step.

9. The magnetic junction of claim 1 wherein the hybrid free layer further includes:
    at least one spin transfer torque (STT) reducing layer between the hard magnetic layer and the soft magnetic layer.

10. The magnetic junction of claim 9 wherein the at least one STT reducing layer includes a first STT reducing layer embedded within the oxide coupling layer.

11. The magnetic junction of claim 9 wherein the at least one STT reducing layer includes a first STT reducing layer at a first interface of the oxide coupling layer.

12. The magnetic junction of claim 1 wherein the hard magnetic layer has a perpendicular anisotropy field of at least 3 kOe and not more than 6 kOe.

13. The magnetic junction of claim 1 wherein the soft magnetic layer has a perpendicular magnetic anisotropy field of at least −2 kOe and not more than 0.

14. The magnetic junction of claim 1 wherein the oxide coupling layer shares a first interface with the soft magnetic layer and a second interface with the hard magnetic layer.

15. The magnetic junction of claim 1 wherein the hard magnetic layer has a perpendicular anisotropy field of at least 3 kOe and not more than 6 kOe, the soft magnetic layer has a perpendicular magnetic anisotropy field magnitude of not more than 2 kOe and at least 0, wherein the oxide coupling layer is configured such that the soft magnetic layer and the hard magnetic layer are magnetically coupled with a characteristic exchange energy density of at least 0.3 erg/cm$^2$ and not more than 0.5 erg/cm$^2$, and the oxide layer has a thickness of at least six Angstroms and not more than nine Angstroms.

16. The magnetic junction of claim 15 wherein the oxide coupling layer shares a first interface with the soft magnetic layer and a second interface with the hard magnetic layer.

17. A magnetic memory comprising:
a plurality of magnetic storage cells, each of the plurality of magnetic storage cells including at least one magnetic junction having a reference layer, a nonmagnetic spacer layer and a hybrid free layer, the hybrid free layer including a soft magnetic layer, a hard magnetic layer and an oxide coupling layer between the hard magnetic layer and the soft magnetic layer, the soft magnetic layer having a soft layer magnetic thermal stability coefficient of not more than thirty at a standby temperature, the hard magnetic layer having a hard layer magnetic thermal stability coefficient of at least twice the soft layer magnetic thermal stability coefficient at the standby temperature, the oxide coupling layer being configured such that the soft magnetic layer and the hard magnetic layer are magnetically coupled with a characteristic exchange energy density of at least 0.3 and not more than 0.5 erg/cm$^2$, the soft layer magnetic layer thermal stability coefficient being a soft magnetic layer anisotropy density multiplied by a soft magnetic layer volume divided by Boltzmann's constant and a temperature of the soft magnetic layer, the hard layer magnetic layer thermal stability coefficient being a hard magnetic layer anisotropy density multiplied by a hard magnetic layer volume divided by Boltzmann's constant and the temperature of the hard magnetic layer, the hybrid free layer being switchable between a plurality of stable magnetic states using a write current passed through the magnetic junction; and
a plurality of bit lines coupled with the plurality of magnetic storage cells.

* * * * *